(12) United States Patent
Frecassetti et al.

(10) Patent No.: US 6,316,994 B1
(45) Date of Patent: Nov. 13, 2001

(54) RESPONSE LINEARIZING CIRCUIT, PARTICULARLY FOR MICROWAVE RADIOFREQUENCY SYSTEMS, AND METHOD OF LINEARIZING THE OUTPUT OF AN APPARATUS

(75) Inventors: Mario Giovanni Luigi Frecassetti, Bergamo; Marco Frigerio, Cesano Maderno; Salvatore Gugliuzzo, Lecco, all of (IT)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/493,114

(22) Filed: Jan. 28, 2000

(30) Foreign Application Priority Data

Feb. 12, 1999 (IT) ............................................. MI99A0274

(51) Int. Cl.[7] ...................................................... H03F 1/26
(52) U.S. Cl. ............................................. 330/149; 330/136
(58) Field of Search ..................................... 330/107, 136, 330/149; 375/296, 297

(56) References Cited

U.S. PATENT DOCUMENTS

| | | |
|---|---|---|
| 3,656,831 | 4/1972 | Seidel . |
| 3,676,790 * | 7/1972 | Beurrier ............................. 330/30 D |
| 4,276,514 * | 6/1981 | Huang ................................. 330/149 |
| 5,467,056 * | 11/1995 | Goumaz .............................. 330/149 |
| 5,742,201 | 4/1998 | Eisenberg et al. . |
| 5,745,006 | 4/1998 | Budnik et al. . |
| 5,745,857 * | 4/1998 | Maeng et al. ....................... 455/553 |

\* cited by examiner

*Primary Examiner*—Robert Pascal
*Assistant Examiner*—Henry Choe
(74) *Attorney, Agent, or Firm*—Sughrue, Mion, Zinn, Macpeak & Seas, PLLC

(57) ABSTRACT

A linearizing circuit (CI) for linearizing the output (OU) of an apparatus (TR), the circuit including a splitter (DI_IN) for subdividing the input signal (IN) into at least first (IN1) and second (IN2) portions and a circuit (DI_OU) for picking up a portion of the signal coming out from the apparatus (TR) to be linearized. The circuit is characterized in that it further includes a first adder (AD1) for adding the picked-up portion of the output signal with the second portion (IN2) of the input signal (IN) and outputting an individual signal which is in turn added to the first portion of input signal (1N1) through a second adder (AD2). A method is also disclosed for linearizing the output of an apparatus, e.g., a power amplifier.

13 Claims, 1 Drawing Sheet

RESPONSE LINEARIZING CIRCUIT, PARTICULARLY FOR MICROWAVE RADIOFREQUENCY SYSTEMS, AND METHOD OF LINEARIZING THE OUTPUT OF AN APPARATUS

BACKGROUND OF THE INVENTION

1. Field of the Invention

The present invention relates to the linearization of non linear networks and in particular concerns a fully adaptive linearizing circuit not using predistortion systems, particularly for microwave radiofrequency systems, and which is independent of the type of modulation. The present invention also concerns a method for linearizing the output of an apparatus, for instance a power amplifier.

2. Description of the Prior Art

The nonlinearity phenomena affect many fields of the electronic engineering. An important aspect, which is substantially the subject-matter of the present invention, is the one related to the nonlinearity of the amplifiers used in the electronic systems applied to telecommunication and in particular, others being not excluded, to digital signal transmission.

Present radio transmission systems, using complex modulations such as the multilevel ones, require more and more complex transceivers. In particular, in current digital signal transmissions, signals with high peak to average power ratios must be transmitted. In order to obtain a good quality of transmission by using these types of signals, it is necessary to keep the distortion value of the processed signal below a prefixed level.

This fact often forces the designers to use, for instance in transmission systems, class-A power amplifiers with high Back-Off values, hence with a low energy efficiency.

The main known linearizing techniques can be classified into four main different groups or methods: a) Feed-forward; b) Feed-back; c) Baseband numeric predistortion; and d) IF or RF analog predistortion. Each specific solution, excluding the Feed-back one which is adaptive by its very nature, can in turn be implemented according to an adaptive or non-adaptive technique.

In the adaptive technique, the linearizing apparatus observes the output produced by the power amplifier and, in dependence on the detected values, updates its internal parameters, so it minimizes the magnitude of the produced distortions. It is easy to understand how this is the ideal solution from the conceptual viewpoint, because it adapts through a suitable algorithm, the linearizing function to the actual behaviour of the system; in practice, the realization is unfortunately complex and, above all, expensive.

In the non-adaptive technique, on the contrary, the linearizing device is adjusted once and for all during the calibration, so as to assure the most satisfactory possible mean behaviour. The system is simpler, but with lower performances, since there is not feed back for controlling the actual status of the distortions coming out of the transmitter.

U.S. Pat. No. 5,742,201 discloses a predistortion linearizing device for an RF or microwave power amplifier. The circuit couples the input of an amplitude and phase controller through a feedback signal path to receive a portion of the amplified output signal. A second input receives a delayed portion of the input over a second signal path. The gain and phase regulations performed at the input to be amplified are controlled by a controller. However such known device has the following main feedbacks:

the system does not act instantaneously but with a delay due to outside controllers, and the feedback loop is based upon the estimation of two or more signal parameters and not upon a sole signal.

SUMMARY OF THE INVENTION

It is, therefore, the primary object of the present invention to provide a fully adaptive linearizing circuit which does not use predistortion systems, particularly for microwave radiofrequency systems, which is independent of the type of modulation.

A further object of the present invention is to provide a fully analog device of a Feed-back type that is utilizable both at intermediate frequency IF and at radio frequency RF.

Still a further object of the present invention is to provide a linearizing device that does not lead to a decrease in the gain of the amplifier chain.

These and further objects are achieved by a linearizing circuit according to the invention having the features set forth in the independent claim 1 and by a method having the features set forth in claim 8. Further advantageous characteristics of the present invention are set forth in the dependent claims.

The basic idea of the present invention consists in picking-up only the distorted portion of the output signal and feeding it back to the amplifier input with the correct amplitude and phase levels in order to completely cancel the output portion of the signal distortions.

The invention will certainly result in being clear from the following a detailed description, given by way of a mere non limiting and exemplifying example, to be read with reference to the annexed illustrative sheets of drawings.

BRIEF DESCRIPTION OF THE DRAWINGS

The various figures show.

Like reference characters will be used throughout the various figures to designate the same components or functionally equivalent parts.

BEST MODE FOR CARRYING OUT THE INVENTION

The present invention falls under the fully analog predistortion category and it is utilizable both at intermediate frequency IF and at radio frequency RF. Moreover, it is structured to be able to operate adaptively, being of the Feed-back type.

Figure 1:
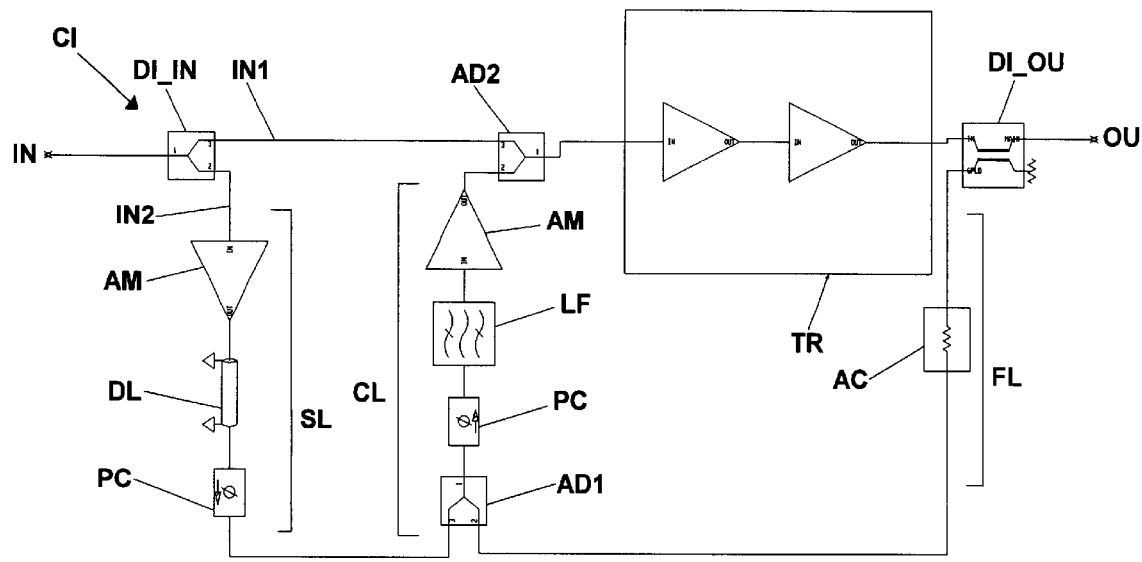
FIG. 1 shows the basic diagram of the linearizing circuit according to the present invention.

With reference to FIG. 1, the circuit CI, according to the invention, for linearizing the output OU of an apparatus TR, for instance an amplifier/transmitter TR, comprises:

a divider DI_IN of the input signal IN;

a signal adder circuit AD2 at the input (i.e. upstream) of the apparatus TR;

an output signal OU divider (coupler) DI_OU;

a feedback loop FL with an amplitude control circuit AC;

a signal loop SL; and a closure loop CL.

The signal loop SL comprises an amplifier AM, a delay line DL and a phase controller PC. The closure loop CL comprises a first adder circuit AD1, an amplifier AM, a loop filter LF and a phase controller PC.

The operating principles of the linearizing circuit in accordance with the present invention will be described hereinafter.

At divider DI_IN, the input signal IN is divided into two parts, IN1, IN2, that may also be unequal. The signal portion IN1 proceeds towards the amplifier TR passing through the second signal adder circuit AD2. Downstream of the amplifier TR to be linearized, a portion of the signal is picked up by means of the output signal OU divider DI_OU. This portion of signal after a suitable level adjustment through circuit AC, is fed to one of the two inputs of the first adder circuit AD1 of the closure loop.

The signal portion IN2 coming out of the divider DI_IN, through the signal loop SL, enters the second input of the second adder circuit AD2. While passing through the loop SL, the signal portion IN2 is amplitude, delay and phase-regulated by means of the amplifier AM, the delay line DL and the phases controller PC, respectively. Such amplitude, delay and phase regulations result in that:

the signal at the two inputs of the adder AD1 has the same amplitude;

the signal at the two inputs of the adder AD1 has a 180-degree phase difference; and the signal at the two inputs of the adder AD1 has the same slope of the group delay characteristic.

In this way, at the output of the adder AD1 we obtain the difference between the output signal sample and the input signal sample. This difference is nothing but the distortion produced by the amplifier (or in general by the apparatus) TR to be linearized.

At this point, the feedback loop is closed through the adder AD1 of the loop CL for the distorted signal alone. By adjusting the amplitude on the closing loop CL, the proper loop gain is determined and, by adjusting the phase (PC), the proper negative feedback is obtained. The loop filter LF serves to stabilize the feedback loop FL.

It will be easily understood that the circuit according to the present invention is different from the conventional feedback circuits since the gain of the amplifier to be linearized is unchanged. This in turn results in an evident and unquestionable economical advantage.

Therefore, calling $G_L$ the gain of the loop and $G_A$ the gain of the amplifier, it follows that the input signal is output multiplied by $G_A$, instead of being reduced to $G_A/|1-G_L|$, but with a distortion level decreased by a factor $1/|1-G_L|$.

Implementatively, the signal band, the group delay slope and the loop gain are connected each other by the need to have a stable system. In order for the system to be suitable, because of the feedback loop FL, it is necessary to restrict the signal band so as to ensure sufficient gain and phase margins, in accordance with the theory. In fact, given an amplifier to be linearized with a given group delay and defined an extent of distortion reduction equal to about the reciprocal of the loop gain ($1/G_L$), a filter is thus defined that ensures the stability and consequently the utilizable band (to be noted that the useful band is only 33% of the filter band, the two distortion lobes having to be taken into account). Therefore, there is a compromise between the improvement to be achieved and the useful band that depends mainly upon the delay of the amplifier to be linearized.

Figure 2:
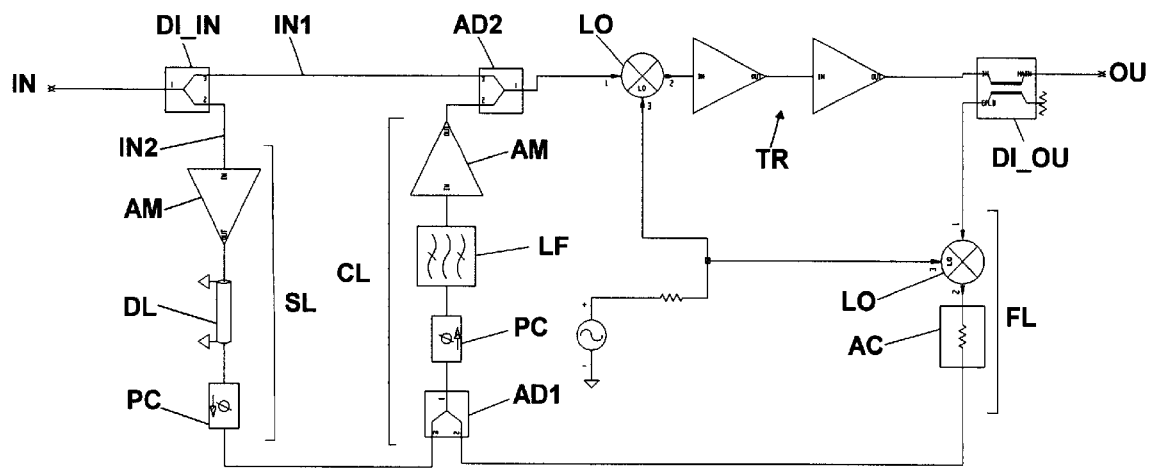
FIG. 2 shows a possible different embodiment of the circuit according to the present invention.

FIG. 2 shows a possible different circuit embodiment according to the present invention. In practice it is shown how, by acting at an intermediate frequency, a diagram substantially equivalent to the one of FIG. 1 can be used. As can be seen, the differences concern the addition of a local oscillator LO which performs a frequency shift in the feedback loop FL and right before the transmitter TR.

The method for linearizing the output of an apparatus TR comprises the steps of subdividing the input signal IN into at least a first (IN1) and a second (IN2) portions and picking up a portion of the signal OU coming out of the apparatus TR to be linearized and it is characterized in that it further comprises the steps of summing the picked up portion of the output signal with the second portion IN2 of the input signal IN thus outputting a signal; and summing said output signal with the first portion IN1 of the input signal upstream of the apparatus to be linerized.

It will now be apparent that the advantageous characteristics, compared with similar systems such that described in the above cited U.S. Pat. No. 5,742,201, are:
1. The two controllers are not necessary;
2. The device according to the present invention is a pure analog system and, as such, it acts quickly with a delay only due to the circuit topology and not to outside controllers; and
3. The feedback loop operates with a single signal and not with the estimate of two or more parameters thereof.

The invention further includes a computer program comprising computer program code means adapted to perform all the steps of the described method when said program is run on a computer. Furthermore, it includes a computer readable medium having a program recorded thereon, said computer readable medium comprising computer program code means adapted to perform all the steps of the described method when said program is run on a computer.

It is apparent that several modifications, adaptations, variations and replacement of parts by other which are functionally equivalent can be carried out to the embodiments illustrated and described in detail above without departing from the scope defined by the following claims which are intended to be an integral part of the present description.

What is claimed is:

1. A linearizing circuit for linearizing an output signal of an apparatus wherein an input signal enters, said linearizing circuit comprising:

a subdivider for subdividing the input signal into at least first and second input signal portions; and an output signal pick-up for picking up a portion of said output signal thus obtaining a picked-up output signal portion, wherein said linearizing circuit further comprises:

a first adder having two inputs, for summing the picked-up output signal portion with the second input signal portion and outputting a single output signal;

a second adder for summing the single output signal, upstream of the apparatus to be linearized, with the first input signal portion, and an input signal adjuster for adjusting amplitude, delay and phase of said second input signal portion before said second input signal portion enters said second adder.

2. A circuit according to claim 1, wherein it further comprises an output signal adjuster for properly adjusting level of said picked-up output signal portion.

3. A circuit according to claim 2, wherein said input signal adjuster and said output signal adjuster operate in such a way that the signals at the two inputs of the first adder have the same amplitude, a phase difference of 180° and the same slope as group delay characteristic.

4. A circuit according to claim 1, wherein it further comprises a further output signal adjuster for adjusting amplitude of said single output signal.

5. A circuit according to claim 1, wherein it further comprises a further output signal adjuster for adjusting phase of said single output signal.

6. A circuit according to claim 1, wherein it further comprises a filter for stabilizing said single output signal.

7. A method for linearizing an output signal of an apparatus wherein an input signal enters, said method comprising the steps of:
   subdividing said input signal into at least first and second input signal portions; and
   picking up a portion of said output signal thus obtaining a picked-up output signal portion,
wherein said method further comprises the steps of:
   summing the picked-up output signal portion with the second input signal portion, thus providing a single output signal;
   summing said single output signal with the first input signal portion upstream of the apparatus to be linearized; and
   adjusting amplitude, delay and phase of said second input signal portion before said second input signal portion is summed with said picked-up output signal portion.

8. A method according to claim 7, wherein it further comprises the step of suitably adjusting a level of said picked-up output signal portion before the step of summing it with said second input signal portion.

9. A method according to claim 8, wherein the step of adjusting amplitude, delay and phase of said second input signal portion and the step of suitably adjusting the level of said picked-up output signal portion result in that said second input signal portion and said picked-up output signal, at the time when they are summed, have the same amplitude, a 180° phase-difference and the same slope as group delay characteristic.

10. A method according to claim 9, wherein the sum of said first input signal portion with said picked-up output signal portion substantially corresponds to distortion produced by said apparatus to be linearized and wherein the method further comprises the step of closing a feedback loop only for a distorted signal.

11. A method according to claim 9, wherein, after the step of summing said second input signal portion with said picked-up output signal portion, the said method further comprises the steps of amplitude and phase regulating said summed signal and stabilizing it before the step of summing it with the first input signal portion.

12. A computer program comprising computer program code adapted to perform method steps for linearizing an output signal of an apparatus wherein an input signal enters, said method steps comprising:
   subdividing said input signal into at least first and second input signal portions;
   picking up a portion of said output signal thus obtaining a picked-up output signal portion;
   summing the picked-up output signal portion with the second input signal portion, thus providing a single output signal;
   summing said single output signal with the first input signal portion upstream of the apparatus to be linearized; and
   adjusting amplitude, delay and phase of said second input signal portion before said second input signal portion is summed with said picked-up output signal portion.

13. A computer readable medium having a program recorded thereon, said computer readable medium comprising computer program code adapted to perform, when said program is run on a computer, method steps for linearizing an output signal of an apparatus wherein an input signal enters, said method steps comprising:
   subdividing said input signal into at least first and second input signal portions;
   picking up a portion of said output signal thus obtaining a picked-up output signal portion;
   summing the picked-up output signal portion with the second input signal portion, thus providing a single output signal;
   summing said single output signal with the first input signal portion upstream of the apparatus to be linearized; and
   adjusting amplitude, delay and phase of said second input signal portion before said second input signal portion is summed with said picked-up output signal portion.

* * * * *